(12) United States Patent
Cheng et al.

(10) Patent No.: US 10,535,739 B2
(45) Date of Patent: Jan. 14, 2020

(54) SEMICONDUCTOR STRUCTURE AND METHOD OF PREPARING SEMICONDUCTOR STRUCTURE

(71) Applicant: ENKRIS SEMICONDUCTOR, INC, Jiangsu (CN)

(72) Inventors: Kai Cheng, Jiangsu (CN); Peng Xiang, Jiangsu (CN)

(73) Assignee: ENKRIS SEMICONDUCTOR, INC, Jiangsu (CN)

( * ) Notice: Subject to any disclaimer, the term of this patent is extended or adjusted under 35 U.S.C. 154(b) by 0 days.

(21) Appl. No.: 16/099,177

(22) PCT Filed: Apr. 24, 2017

(86) PCT No.: PCT/CN2017/081656
§ 371 (c)(1),
(2) Date: Nov. 5, 2018

(87) PCT Pub. No.: WO2018/195701
PCT Pub. Date: Nov. 1, 2018

(65) Prior Publication Data
US 2019/0214467 A1    Jul. 11, 2019

(51) Int. Cl.
*H01L 33/00* (2010.01)
*H01L 29/15* (2006.01)
(Continued)

(52) U.S. Cl.
CPC ........ *H01L 29/155* (2013.01); *H01L 21/0254* (2013.01); *H01L 21/02458* (2013.01);
(Continued)

(58) Field of Classification Search
CPC .............................................. H01L 21/02458
See application file for complete search history.

(56) References Cited

U.S. PATENT DOCUMENTS 5,076,860 A * 12/1991 Ohba ..................... B82Y 20/00
117/89
6,657,234 B1 * 12/2003 Tanizawa ............... B82Y 20/00
257/103
(Continued)

FOREIGN PATENT DOCUMENTS

| CN | 102714162 A | 10/2012 |
| CN | 104518019 A | 4/2015 |
| CN | 105580146 A | 5/2016 |

OTHER PUBLICATIONS

ISA/CN, International Search Report dated Jan. 25, 2018 in International Application No. PCT/CN2017/081656, total 6 pages with English translation.

*Primary Examiner* — Thao P Le
(74) *Attorney, Agent, or Firm* — Masuvalley & Partners

(57) ABSTRACT

The invention provides a semiconductor structure and a method of preparing a semiconductor structure, which solves the problems of easy cracking, large warpage and large dislocation density which exist in epitaxial growth of a semiconductor compound epitaxial structure on a substrate in the prior art. The semiconductor structure includes: a substrate; at least one periodic structure disposed over the substrate; wherein each of the periodic structures includes at least one period, each period including a first periodic layer and a second periodic layer which are sequentially stacked in an epitaxial direction; wherein the thickness of the nth periodic structure is smaller than the thickness of the (n+1)th periodic structure, wherein n is an integer greater than or equal to 1.

10 Claims, 1 Drawing Sheet

(51) Int. Cl.
*H01L 29/20* (2006.01)
*H01L 23/00* (2006.01)
*H01L 29/205* (2006.01)
*H01L 21/02* (2006.01)

(52) U.S. Cl.
CPC ...... *H01L 21/02507* (2013.01); *H01L 23/562* (2013.01); *H01L 29/15* (2013.01); *H01L 29/2003* (2013.01); *H01L 29/205* (2013.01)

(56) References Cited

U.S. PATENT DOCUMENTS

| | | | |
|---|---|---|---|
| 7,312,472 B2 * | 12/2007 | Chiyo | H01L 21/0237 257/200 |
| 8,101,498 B2 * | 1/2012 | Pinnington | B82Y 20/00 257/617 |
| 9,070,805 B2 * | 6/2015 | Fudeta | H01L 33/04 |
| 2004/0004223 A1 * | 1/2004 | Nagahama | B82Y 20/00 257/74 |
| 2005/0040406 A1 | 2/2005 | Nakagawa | |
| 2005/0211971 A1 * | 9/2005 | Okumura | B82Y 20/00 257/14 |
| 2007/0045638 A1 * | 3/2007 | Shen | H01L 33/32 257/94 |
| 2007/0152232 A1 * | 7/2007 | Kobayakawa | H01L 29/2003 257/103 |
| 2008/0191192 A1 * | 8/2008 | Feezell | B82Y 20/00 257/13 |
| 2010/0288999 A1 * | 11/2010 | Kikuchi | H01L 33/06 257/13 |
| 2011/0187294 A1 * | 8/2011 | Bergmann | H01L 33/04 315/363 |
| 2011/0188528 A1 * | 8/2011 | Kisin | B82Y 20/00 372/44.011 |

* cited by examiner

SEMICONDUCTOR STRUCTURE AND METHOD OF PREPARING SEMICONDUCTOR STRUCTURE

RELATED APPLICATIONS

This application is a national phase application under 35 U.S.C. § 371 of International Patent Application No. PCT/CN2017/081656, filed on Apr. 24, 2017, which is hereby expressly incorporated by reference in its entirety for all purposes.

TECHNICAL FIELD

The present invention relates to semiconductor technology, and more particularly to a semiconductor structure and a method of preparing a semiconductor structure.

BACKGROUND OF THE DISCLOSURE

Semiconductor compounds are widely used in the preparation of various light-emitting elements and electronic components because of their excellent semiconductor properties. A component action layer prepared using a semiconductor compound is generally formed by epitaxial growth on a substrate. However, when the semiconductor compound structure is epitaxially grown on the substrate, a large tensile stress may be generated in the process of cooling from a high temperature, resulting in a very large tensile strain.

Although the lattice mismatch between epitaxially grown semiconductor compounds and the substrate may introduce some pressing stress to balance the tensile stress, the closer the dislocation density is to the substrate, the greater the dislocation density in the epitaxial structure, and the dislocation will lead to the release of the pressing stress, and the released pressing stress will not be able to balance the tensile stress. Therefore, the existing epitaxial growth of semiconductor structures cannot function better in balancing the tensile stress, so that the epitaxial growth of the semiconductor structure surface will still be due to the existence of the tensile stress caused by cracking and warping problems.

SUMMARY OF THE INVENTION

In view of the above, the present invention provides a semiconductor structure and a method of preparing a semiconductor structure, which solves the problems of easy cracking, warpage, and dislocation density which exist in epitaxial growth of a semiconductor compound epitaxial structure on a substrate in the prior art.

A semiconductor structure provided by an embodiment of the invention includes:
a substrate;
at least a periodic structure disposed above said substrate;
wherein the materials of said periodic structures are III-V group compounds, each said periodic structure includes at least one period, each said period includes a first periodic layer and a second periodic layer which are sequentially stacked in an epitaxial direction;
wherein said first periodic layer includes a first III group element, a second III group element and a first V group element, said second periodic layer includes said first III group element, said second III group element and said first V group element; or, said first periodic layer includes said first III group element and said first V group element, said second periodic layer includes said first III group element, said second III group element and said first V group element;
wherein the atomic number of said first III element is smaller than the atomic number of said second III element;
wherein the thickness of the nth periodic structure is smaller than the thickness of the (n+1)th periodic structure, wherein n is an integer greater than or equal to 1.

Wherein, said first III group element is Al, said second III group element is Ga, and said first V group element is N.

Wherein, the number of periods of said nth periodic structure is less than the number of periods of said (n+1)th periodic structure.

Wherein, the thickness of the first periodic layer of the nth periodic structure in the epitaxial direction in said at least one periodic structure is greater than the thickness of the first periodic layer of the (n+1)th periodic structure, the thickness of the second periodic layer of the nth periodic structure is equal to the thickness of the second periodic layer of the (n+1)th periodic structure; or
in said at least one periodic structure, the thickness of the first periodic layer of the nth periodic structure in the epitaxial direction is equal to the thickness of the first periodic layer of the (n+1)th periodic structure, and the thickness of the second periodic layer of the nth periodic structure is smaller than the thickness of the second periodic layer of the (n+1)th periodic structure; or
in said at least one periodic structure, the thickness of the first periodic layer of the nth periodic structure in the epitaxial direction is greater than the thickness of the first periodic layer of the (n+1)th periodic structure, and the thickness of the second periodic layer of the nth periodic structure is less than the thickness of the second periodic layer of the (n+1)th periodic structure.

Wherein, the periodic structure includes three periodic structures, a first periodic structure includes 40 periods, a second periodic structure includes 50 periods, and a third periodic structure includes 60 periods;
in the three periodic structures, the thickness of the first periodic layer is 3 nm~10 nm, the thickness of the first periodic layer of the nth periodic structure is greater than the thickness of the first periodic layer of the (n+1)th periodic structure by 2 nm~3 nm; and/or, the thickness of the second periodic layer in the three periodic structures is 10 nm~30 nm, the thickness of the second periodic layer of the nth periodic structure is smaller than the thickness of the second periodic layer of the (n+1)th periodic structure by 0 nm~10 nm.

Wherein, the semiconductor structure includes five periodic structures, a first periodic structure includes 10 periods, a second periodic structure includes 20 periods, and a third periodic structure includes 30 periods, a fourth periodic structure includes 40 periods, and a fifth structure includes 45 periods;
the thickness of the first periodic layer in the five periodic structures is the same, i.e., 5 nm~10 nm; and/or, the thickness of the second periodic layer in the five periodic structures is 10 nm~25 nm, the thickness of the second periodic layer of the nth periodic structure is smaller than the thickness of the second periodic layer of the (n+1)th periodic structure by 0 nm~5 nm.

Wherein, the thickness of said second periodic layer is greater than the thickness of said first periodic layer in the same periodic structure.

Wherein, the at least a periodic structure is sequentially stacked in an epitaxial direction of said substrate.

Wherein, the semiconductor structure further includes: a nucleation layer disposed between said substrate and the first one of said periodic structures.

Wherein, said nucleation layer includes one or more of AlN, AlGaN.

Wherein, the semiconductor structure further includes: a component active layer disposed over said at least one periodic structure.

Wherein, said component active layer includes one or more of GaN, AlGaN, AlInGaN.

Wherein, said substrate includes one or more of Si, SiC, GaN, $Al_2O_3$.

An embodiment of the present invention provides a method of preparing a semiconductor structure, including: preparing at least one periodic structure over a substrate; wherein the materials of said periodic structures are III-V group compounds, each said periodic structure includes at least one period, each said period includes a first periodic layer and a second periodic layer which are sequentially stacked in an epitaxial direction; wherein said first periodic layer includes a first III group element, a second III group element and a first V group element, said second periodic layer includes said first III group element, said second III group element and said first V group element; or, said first periodic layer includes said first III group element and said first V group element, said second periodic layer includes said first III group element, said second III group element and said first V group element; wherein the atomic number of said first III element is smaller than the atomic number of said second III element; wherein the thickness of the nth periodic structure is smaller than the thickness of the (n+1)th periodic structure, wherein n is an integer greater than or equal to 1.

As for the semiconductor structure and the method of preparing a semiconductor structure provided by embodiments of the invention, considered that the dislocation density of a position in the epitaxial structure closer to the substrate is larger, and the position with large dislocation density easily cause the release of the pressing stress, the released pressing stress will not take effect to balance the tensile stress. Therefore, a periodic structure with a lower dislocation density may have a larger thickness by setting the thickness of the nth periodic structure along the epitaxial direction smaller than the thickness of the (n+1)th periodic structure, such that the pressing stress introduced in a periodic structure far away from the substrate can better balance the tensile stress, thereby effectively balance the release of the pressing stress in the entire epitaxial structure, ensuring an equilibrium effect of the pressing stress against the tensile stress in the entire epitaxial structure, such that the entire epitaxial structure will not easily get cracked and warped.

DETAILED DESCRIPTION OF THE INVENTION

In order to better understand the objects, technical means and advantages of the present invention, the present invention will be further described in detail below with reference to the accompanying drawings.

Embodiment 1

Figure 1:
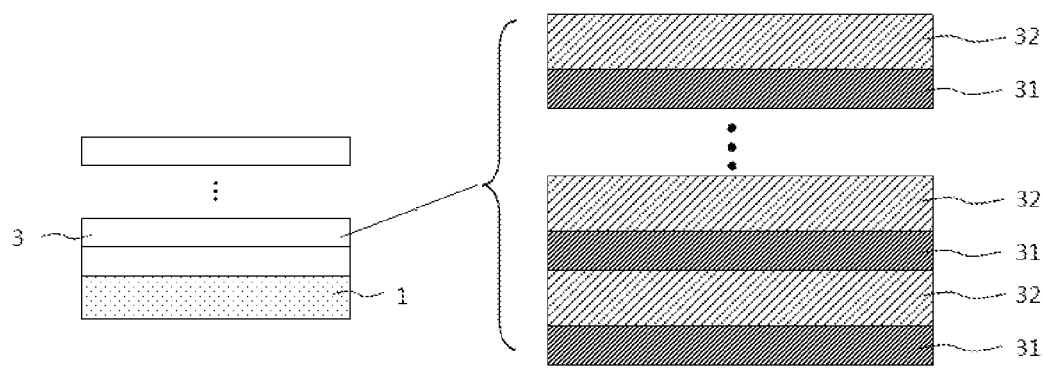
FIG. 1 is a schematic diagram of a semiconductor structure according to an embodiment of the invention.

FIG. 1 is a schematic diagram of a semiconductor structure according to an embodiment of the invention. As shown in FIG. 1, the semiconductor structure includes a substrate 1, and at least one periodic structure 3 disposed above the substrate 1. Each of the periodic structures 3 includes at least one period, and each period includes a first periodic layer 31 and a second periodic layer 32 which are sequentially superposed in the epitaxial direction.

Figure 2:
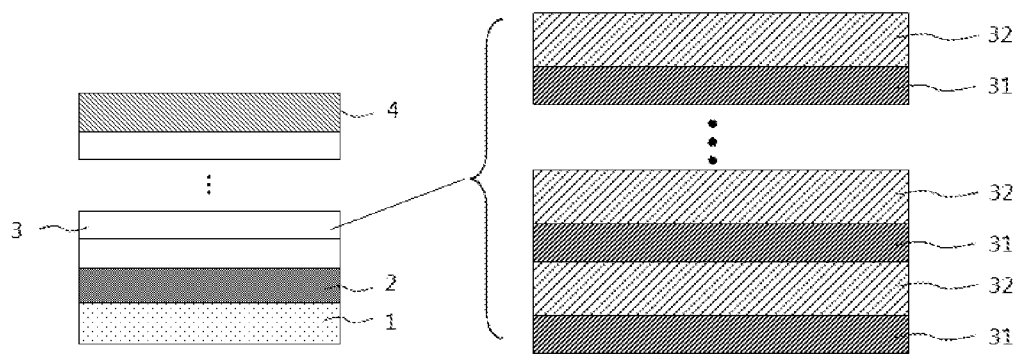
FIG. 2 is a schematic diagram of a semiconductor structure according to another embodiment of the present invention.

In an embodiment of the present invention, as shown in FIG. 2, in order to reduce the dislocation density and the defect density and prevent melt-back, the semiconductor structure may further include a nucleation layer 2 disposed between the substrate 1 and the first periodic structure 3. In another embodiment of the invention, in order to form a complete electronic component structure, the semiconductor structure may further include a component action layer 4 disposed over the at least one periodic structure 3. The active regions may be continuously stacked on the component action layer 4, and the active regions may be selected from a light-emitting diode formed by an indium gallium nitride/gallium nitride multi-quantum well structure and a p-type nitride, a high electron mobility transistor formed by an aluminum gallium nitride/gallium nitride heterostructure, a high electron mobility transistor formed by an aluminum gallium indium nitride/gallium nitride heterostructure, a high mobility triode formed by an aluminum nitride/gallium nitride heterostructure, a gallium nitride MOSFET, a UV-LED, a photodetector, a hydrogen generator or solar battery.

In an embodiment of the invention, the nucleation layer 2 may include one or more of AlN and AlGaN. The component action layer 4 may include one or more of GaN, AlGaN, and AlInGaN. The substrate 1 may include one or more of Si, SiC, GaN, and $Al_2O_3$. However, the materials for the nucleation layer 2, the component action layer 4, and the substrate 1 can be adjusted according to requirements of actual applications, which are not limited by the present invention.

The materials of the periodic layers in the periodic structure 3 are III-V group compounds. Specifically, the first periodic layer 31 includes a first III group element, a second III group element and a first V group element, the second periodic layer 32 includes the first III group element, the second III group element and the first V group element; or, the first periodic layer 31 includes the first III group element and the first V group element, the second periodic layer 32 includes the first III group element, the second III group element and the first V group element; wherein the atomic number of the first III group element is smaller than the atomic number of the second III group element; wherein the thickness of the nth periodic structure 3 is smaller than the thickness of the (n+1)th periodic structure 3, wherein n is an integer greater than or equal to 1.

In an embodiment of the present invention, by setting the number of periods of the nth periodic structure 3 smaller than the number of periods of the (n+1)th periodic structure 3, it can be achieved that the thickness of the nth periodic structure 3 is smaller than the thickness of the (n+1)th periodic structure 3. By setting the number of periods to achieve the thickness adjustment for the adjacent two periodic structures 3, the process may be simply achieved.

As may be seen, in the semiconductor structure provided by the embodiment of the present invention, considered that the dislocation density of a position in the epitaxial structure closer to the substrate is larger, and the position with large dislocation density easily cause the release of the pressing stress, the released pressing stress will not take effect to balance the tensile stress. Therefore, a periodic structure with a lower dislocation density may have a larger thickness by setting the thickness of the nth periodic structure 3 along the epitaxial direction smaller than the thickness of the (n+1)th periodic structure 3, such that the pressing stress introduced in a periodic structure far away from the substrate can better balance the tensile stress, thereby effectively balance the release of the pressing stress in the entire epitaxial structure, ensuring an equilibrium effect of the pressing stress against the tensile stress in the entire epitaxial structure, such that the entire epitaxial structure will not easily get cracked and warped.

In an embodiment of the invention, the first III group element is Al, the second III group element is Ga, and the first V group element is N, so that the material of the first periodic layer 31 can be represented as $Al_yGa_{1-y}N$, and the material of the second periodic layer 32 can be represented as $Al_xGa_{1-x}N$.

In a further embodiment of the invention, the thickness $T_2$ of the second periodic layer 32 may also be greater than the thickness $T_1$ of the first periodic layer 31 in the same periodic structure 3. Therefore, in one periodic structure 3, the thickness of the first periodic layer 31 having a greater percentage of the number of atoms of Al is smaller than the thickness of the second periodic layer 32 having a lower percentage of the number of atoms of Al, which may further reduce the release of pressing stress, reduce dislocation density throughout the epitaxial structure, and improve material and device performance.

It should be understood that although the III group element is defined as Al or Ga in the description of the above embodiments, and the V group element is defined as N, other III group elements and V group elements may also be included in the periodic structure 3, the specific selection for the III group element and the V group element in the present invention is not limited. Meanwhile, the material of the periodic layer may also use a trivalent or higher III-V group compound, and the number of the III group element and the V group element included in the periodic layer is not limited by the present invention.

In an embodiment of the invention, as shown in FIG. 1, the at least one periodic structure 3 is sequentially stacked in the epitaxial direction of the substrate 1. However, it should be understood that the at least one periodic structure 3 may not be sequentially stacked, but be interposed with other semiconductor structures (for example, at least one III-V group compound layer in which the percentage of number of atoms of Al in compound composition becomes smaller in the epitaxial direction and then becomes larger, and the thickness of the smaller portion is larger than the thickness of the larger portion to form a periodically varying stress field so as to further reduce the dislocation density in the epitaxial structure and further introduce pressing stress), and the present invention does not limit the arranged structure for the periodic structure 3 above the substrate 1. In addition, the specific number of the at least one periodic structure 3 can also be adjusted according to the needs of actual applications, and the number of the periodic structures 3 located above the substrate 1 is also not limited by the present invention.

Embodiment 2

When the thickness of periodic structure 3 along the epitaxial direction is increased by increasing the number of periods along the epitaxial direction, the thickness of the adjacent periodic structures 3 can also be independently adjusted. More specifically, in at least one periodic structure 3, the thickness of the first periodic layer 31 of the nth periodic structure 3 in the epitaxial direction may be greater than the thickness of the first periodic layer 31 of the (n+1)th periodic structure 3, the thickness of the second periodic layer 32 of the nth periodic structure 3 may be equal to the thickness of the second periodic layer 32 of the (n+1)th periodic structure 3; or, in at least one periodic structure 3, the thickness of the second periodic layer 32 of the nth periodic structure 3 in the epitaxial direction may be less than that of the second periodic layer 32 of the (n+1)th periodic structure 3, and the thickness of the first periodic layer 31 of the nth periodic structure 3 in the epitaxial direction may be equal to the thickness of the first periodic layer 31 of the (n+1)th periodic structure 3; or, in at least one periodic structure 3, the thickness of the first periodic layer 31 of the nth periodic structure 3 in the epitaxial direction may be greater than the thickness of the first periodic layer 31 of the (n+1)th periodic structure 3, the thickness of the second periodic layer 32 of the nth periodic structure 3 may be smaller than the thickness of the second periodic layer 32 of the (n+1)th periodic structure 3.

In an embodiment of the present invention, there are three periodic structures 3 above the substrate 1:

A first periodic structure 3 is a periodic structure 3 with 40 periods, wherein $Al_{0.8}Ga_{0.2}N$ (thickness 10 nm) and $Al_{0.3}Ga_{0.7}N$ (thickness 10 nm) are sequentially stacked in one period;

A second periodic structure 3 is a periodic structure 3 with 50 periods, wherein $Al_{0.8}Ga_{0.2}N$ (thickness 10 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 10 nm) and $Al_{0.3}Ga_{0.7}N$ (thickness 30 nm) are sequentially stacked in one period.

In another embodiment of the present invention, there are three periodic structures 3 above the substrate 1:

A first periodic structure 3 is a periodic structure 3 with 40 periods, wherein $Al_{0.8}Ga_{0.2}N$ (thickness 10 nm) and $Al_{0.3}Ga_{0.7}N$ (thickness 20 nm) are sequentially stacked in one period;

A second periodic structure 3 is a periodic structure 3 with 50 periods, wherein $Al_{0.8}Ga_{0.2}N$ (thickness 7 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 4 nm) and $Al_{0.3}Ga_{0.7}N$ (thickness 20 nm) are sequentially stacked in one period.

In another embodiment of the present invention, there are three periodic structures 3 above the substrate 1:

A first periodic structure 3 is a periodic structure 3 with 40 periods, wherein $Al_{0.8}Ga_{0.2}N$ (thickness 8 nm) and $Al_{0.3}Ga_{0.7}N$ (thickness 15 nm) are sequentially stacked in one period;

A second periodic structure 3 is a periodic structure 3 with 50 periods, wherein $Al_{0.8}Ga_{0.2}N$ (thickness 5 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 3 nm) and $Al_{0.3}Ga_{0.7}N$ (thickness 25 nm) are sequentially stacked in one period.

In another embodiment of the present invention, there are three periodic structures 3 above the substrate 1:

A first periodic structure 3 is a periodic structure 3 with 40 periods, in which AlN (thickness 5 nm) and $Al_{0.3}Ga_{0.7}N$ (thickness 10 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 5 nm) and $Al_{0.3}Ga_{0.7}N$ (thickness 30 nm) are sequentially stacked in one period.

In another embodiment of the present invention, there are three periodic structures 3 above the substrate 1:

A first periodic structure 3 is a periodic structure 3 with 40 periods, wherein AlN (thickness 8 nm) and $Al_{0.3}Ga_{0.7}N$ (thickness 20 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 3 nm) and $Al_{0.3}Ga_{0.7}N$ (thickness 20 nm) are sequentially stacked in one period.

In another embodiment of the present invention, there are three periodic structures 3 above the substrate 1:

A first periodic structure 3 is a periodic structure 3 with 40 periods, wherein AlN (thickness 8 nm) and $Al_{0.3}Ga_{0.7}N$ (thickness 15 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 3 nm) and $Al_{0.3}Ga_{0.7}N$ (thickness 25 nm) are sequentially stacked in one period.

It should be understood that although in the above embodiment including three periodic structures 3, the thickness of the first periodic layer 31 of the three periodic structures 3 is 3 nm~10 nm, and the thickness of the first periodic layer 31 of the nth periodic structure 3 is larger than the thickness of the first periodic layer 31 of the (n+1)th periodic structure 3 by 2 nm~3 nm; the thickness of the second periodic layer 32 of the three periodic structures 3 is 10 nm~30 nm, and the thickness of the second periodic layer 32 of the nth periodic structure 3 is smaller than the thickness of the second periodic layer 32 of the (n+1)th periodic structure 3 by 0 nm to 10 nm (for example, 0 nm, 5 nm, and 10 nm), but the specific thickness of the first periodic layer 31 and the second periodic layer 32 can be adjusted according to the needs of specific applications, and the number of periods of each periodic structure 3 can also be adjusted accordingly. For example, in another embodiment of the present invention, there are five periodic structures 3 disposed above the substrate 1, a first periodic structure 3 may include 10 periods, and a second periodic structure 3 may include 20 periods, a third periodic structure 3 may include 30 periods, a fourth periodic structure 3 may include 40 periods, and a fifth periodic structure 3 may include 45 periods. The thickness of the first periodic layer 31 in the five periodic structures 3 is equal, i.e., 5 nm~10 nm; the thickness of the second periodic layer 32 in the five periodic structures 3 is 10 nm~25 nm, and the thickness of the second periodic layer 32 of the nth periodic structure 3 is smaller than the thickness of the second periodic layer 32 of the (n+1)th periodic structure 3 by 0 nm to 5 nm. However, the present invention does not specifically limit the specific thickness of the first periodic layer 31 and the second periodic layer 32 and the number of periods for each periodic structure 3.

Embodiment 3

An embodiment of the present invention provides a method of preparing a semiconductor structure. The method includes: preparing at least a periodic structure 3 above a substrate 1; wherein the materials of the periodic structures 3 are III-V group compounds, each periodic structure 3 includes at least a period, each period includes a first periodic layer 31 and a second periodic layer 32 which are stacked sequentially along an epitaxial direction; wherein the first periodic layer 31 includes a first III group element, a second III group element and a first V group element, the second periodic layer 32 includes the first III group element, the second III group element and the first V group element; or, the first periodic layer 31 includes the first III group element and the first V group element, the second periodic layer 32 includes the first III group element, the second III group element and the first V group element; wherein the atomic number of the first III group element is smaller than the atomic number of the second III group element; wherein the thickness of the nth periodic structure 3 is smaller than the thickness of the (n+1)th periodic structure 3, wherein n is an integer greater than or equal to 1.

In an embodiment of the present invention, the number of periods of the nth periodic structure 3 is smaller than the number of periods of the (n+1)th periodic structure 3, such that the thickness of the nth periodic structure 3 is smaller than that of the (n+1)th periodic structure 3.

In an embodiment of the present invention, the at least a periodic structure 3 may be prepared by using a metal vapor deposition method, however, it should be understood that, the specific method of preparing the periodic structure 3 may be adjusted according to specific composition, the specific method for preparing the at least a periodic structure 3 is not limited by the present invention.

It should be understood that, the substrate 1 may be obtained directly, or by a preparing process, the skilled in the art may selectively obtain a suitable substrate 1 directly or obtain it by a preparing process, the specific method for obtaining the substrate 1 is not limited by the present invention.

As for the semiconductor structures prepared by above mentioned methods, considered that the dislocation density of a position in the epitaxial structure closer to the substrate is larger, and the position with large dislocation density easily cause the release of the pressing stress, the released pressing stress will not take effect to balance the tensile stress. Therefore, a periodic structure 3 with a lower dislocation density may have a larger thickness by setting the thickness of the nth periodic structure 3 along the epitaxial direction smaller than the thickness of the (n+1)th periodic structure 3, such that the pressing stress introduced in a periodic structure 3 far away from the substrate can better balance the tensile stress, thereby effectively balance the release of the pressing stress in the entire epitaxial structure, ensuring an equilibrium effect of the pressing stress against the tensile stress in the entire epitaxial structure, such that the entire epitaxial structure will not easily get cracked and warped.

It should be understood that, for better understanding technical solutions of the invention, qualifiers "first", "second" and "third" are merely used to differentiate varieties of III group elements or V group elements, and to differentiate varieties of periodic layers; meanwhile, characters "n", "x", and "y" are merely used to better explain the technical solutions of the present invention, all the above qualifiers, symbols and characters shall not be used to limit the protection scope of the present invention.

The above are only preferable embodiments of the invention which are not intended to limit the scope of protection of the invention. All modifications, equivalent substitutions, and improvements made within the spirit and principles of the present invention shall be included within the protection scope of the present invention.

The invention claimed is:

1. A semiconductor structure, characterized in that, the semiconductor structure includes:
    a substrate;
    at least a periodic structure disposed above said substrate;
    wherein the materials of said periodic structures are III-V group compounds, each said periodic structure includes at least one period, each said period includes a first periodic layer and a second periodic layer which are sequentially stacked in an epitaxial direction;
    wherein said first periodic layer includes a first III group element, a second III group element and a first V group element, said second periodic layer includes said first III group element, said second III group element and said first V group element; or, said first periodic layer includes said first III group element and said first V group element, said second periodic layer includes said first III group element, said second III group element and said first V group element; wherein the atomic number of said first III element is smaller than the atomic number of said second III element;
    wherein the thickness of the nth periodic structure is smaller than the thickness of the (n+1)th periodic structure, wherein n is an integer greater than or equal to 1.

2. The semiconductor structure according to claim 1, characterized in that, said first III group element is Al, said second III group element is Ga, and said first V group element is N.

3. The semiconductor structure according to claim 1, characterized in that, the number of periods of said nth periodic structure is less than the number of periods of said (n+1)th periodic structure.

4. The semiconductor structure according to claim 3, characterized in that, the thickness of said first periodic layer of said nth periodic structure in the epitaxial direction in said at least one periodic structure is greater than the thickness of said first periodic layer of said (n+1)th periodic structure, the thickness of said second periodic layer of said nth periodic structure is equal to the thickness of said second periodic layer of said (n+1)th periodic structure; or
    in said at least one periodic structure, the thickness of said first periodic layer of said nth periodic structure in the epitaxial direction is equal to the thickness of said first periodic layer of said (n+1)th periodic structure, and the thickness of said second periodic layer of said nth periodic structure is smaller than the thickness of said second periodic layer of said (n+1)th periodic structure; or
    in said at least one periodic structure, the thickness of said first periodic layer of said nth periodic structure in the epitaxial direction is greater than the thickness of said first periodic layer of said (n+1)th periodic structure, and the thickness of said second periodic layer of said nth periodic structure is less than the thickness of said second periodic layer of said (n+1)th periodic structure.

5. The semiconductor structure according to claim 1, characterized in that, the thickness of said second periodic layer is greater than the thickness of said first periodic layer in the same periodic structure.

6. The semiconductor structure according to claim 1, characterized in that, further including: a nucleation layer disposed between said substrate and the first one of said periodic structures.

7. The semiconductor structure according to claim 6, characterized in that, said nucleation layer includes one or more of AlN, AlGaN.

8. The semiconductor structure according to claim 1, characterized in that, further including: a component active layer disposed over said at least one periodic structure.

9. The semiconductor structure according to claim 8, characterized in that, said component active layer includes one or more of GaN, AlGaN, AlInGaN.

10. A method of preparing a semiconductor structure, characterized in that, including:
    preparing at least one periodic structure over a substrate;
    wherein the materials of said periodic structures are III-V group compounds, each said periodic structure includes at least one period, each said period includes a first periodic layer and a second periodic layer which are sequentially stacked in an epitaxial direction; wherein said first periodic layer includes a first III group element, a second III group element and a first V group element, said second periodic layer includes said first III group element, said second III group element and said first V group element; or, said first periodic layer includes said first III group element and said first V group element, said second periodic layer includes said first III group element, said second III group element and said first V group element; wherein the atomic number of said first III element is smaller than the atomic number of said second III element; wherein the thickness of the nth periodic structure is smaller than the thickness of the (n+1)th periodic structure, wherein n is an integer greater than or equal to 1.

* * * * *